US009553036B1

(12) United States Patent
Hsu et al.

(10) Patent No.: US 9,553,036 B1
(45) Date of Patent: Jan. 24, 2017

(54) SEMICONDUCTOR PACKAGE AND MANUFACTURING METHOD THEREOF

(71) Applicant: Powertech Technology Inc., Hsinchu County (TW)

(72) Inventors: Shou-Chian Hsu, Hsinchu County (TW); Hiroyuki Fujishima, Hsinchu County (TW)

(73) Assignee: Powertech Technology Inc., Hsinchu County (TW)

(*) Notice: Subject to any disclaimer, the term of this patent is extended or adjusted under 35 U.S.C. 154(b) by 0 days.

(21) Appl. No.: 14/794,834

(22) Filed: Jul. 9, 2015

(51) Int. Cl.
| | | |
|---|---|---|
| *H01L 25/065* | (2006.01) | |
| *H01L 21/48* | (2006.01) | |
| *H01L 23/36* | (2006.01) | |
| *H01L 21/56* | (2006.01) | |
| *H01L 25/00* | (2006.01) | |

(52) U.S. Cl.
CPC ............ *H01L 23/36* (2013.01); *H01L 21/486* (2013.01); *H01L 21/565* (2013.01); *H01L 25/0657* (2013.01); *H01L 25/50* (2013.01)

(58) Field of Classification Search
CPC .............. H01L 21/76877; H01L 21/76895; H01L 23/36; H01L 21/52; H01L 21/561; H01L 23/5226; H01L 23/552; H01L 23/3675; H01L 23/528; H01L 23/5389; H01L 23/49816; H01L 24/24; H01L 24/82; H01L 2924/3025; H01L 21/565
USPC .................. 438/122, 127, 613; 257/659, 712
See application file for complete search history.

(56) References Cited

U.S. PATENT DOCUMENTS

| | | | |
|---|---|---|---|
| 8,564,114 B1 | 10/2013 | Lanzone | |
| 2002/0070443 A1* | 6/2002 | Mu ....................... | H01L 21/561 257/712 |
| 2011/0037165 A1* | 2/2011 | Oh ........................ | H01L 21/561 257/712 |

(Continued)

FOREIGN PATENT DOCUMENTS

| | | |
|---|---|---|
| CN | 202829922 | 3/2013 |
| TW | I431734 | 3/2014 |

OTHER PUBLICATIONS

"Office Action of Taiwan Counterpart Application", issued on May 5, 2016, p. 1-p. 5.

*Primary Examiner* — Thomas L Dickey
*Assistant Examiner* — Changhyun Yi
(74) *Attorney, Agent, or Firm* — Jianq Chyun IP Office (57) ABSTRACT

A semiconductor package including an insulating layer, a chip, a thermal interface material, a heat-dissipating cover and a re-distribution layer is provided. The insulating layer has an accommodating opening. The chip is disposed in the accommodating opening. The chip has an active surface, a back surface opposite to the active surface and a side surface connected to the active surface and the back surface. The thermal interface material is filled in the accommodating opening for at least encapsulating the side surface of the chip and exposing the active surface. The re-distribution layer and the heat-dissipating cover are disposed on two side of the insulating layer respectively. The heat-dissipating cover is thermally coupled to the chip through the thermal interface material. The re-distribution layer covers the active surface of the chip and the thermal interface material, and the re-distribution layer is electrically connected to the chip.

15 Claims, 4 Drawing Sheets

(56) References Cited

U.S. PATENT DOCUMENTS

2012/0273959 A1* 11/2012 Park .................. H01L 24/97
                                                    257/774
2012/0306067 A1  12/2012 Tsao et al.
2014/0124906 A1   5/2014 Park et al.

* cited by examiner

SEMICONDUCTOR PACKAGE AND MANUFACTURING METHOD THEREOF

BACKGROUND

Field of the Invention

The invention relates to a package and a manufacturing method thereof, and more particularly to a semiconductor package and a manufacturing method thereof.

Description of Related Art

To satisfy the needs for electronic products to be slim and small, semiconductor packages serving as core elements of the electronic products also develop toward miniaturization. Recently in the industry, a miniature semiconductor package such as chip-size package (CSP) has been developed, which is characterized in that a size of the CSP is approximately a size of a chip thereof or slightly larger than the size of the chip thereof. On the other hand, in addition to the miniature size, the semiconductor packages also need to enhance integrity and an amount of input/output terminals (I/O) for electrical connection to external electronic devices such as a circuit board, so as to satisfy the needs for electronic products to have high performance and high processing speed. To be able to arrange more input/output terminals (I/O) on a limited area of an active surface of the chip, wafer-level semiconductor packages such as Wafer-Level Chip-Size Package (WLCSP) is emerged.

Current WLCSP is generally manufactured by first performing a molding process so that a molding compound covers a backside of the chip and a side surface connected to the backside while exposing an active surface opposite to the backside. Then, a re-distribution layer is formed on the molding compound and the active surface of the chip, and the input/output terminals (I/O) on the active surface of the chip are electrically connected to the re-distribution layer. Generally speaking, the molding compound formed via the molding process is thicker, which is unfavorable to the miniaturization of the WLCSP. In addition, since the molding compound has a lower thermal conductivity coefficient and unfavorable heat-dissipating effects, heat generated by the chip is mostly transmitted outside via a re-distribution layer, which has limited heat-dissipating area or heat-dissipating path. Therefore, heat-dissipating efficiency is unfavorable. Under the circumstance that the heat cannot be rapidly transmitted to the outside and is accumulated inside the WLCSP, a warpage may easily occur in the WLCSP.

SUMMARY OF THE INVENTION

A semiconductor package is provided, which has preferable heat-dissipating efficiency.

A method for manufacturing a semiconductor package is provided, capable of manufacturing a semiconductor package having preferable heat-dissipating efficiency.

A semiconductor package is provided, including an insulating layer, a chip, a thermal interface material, a heat-dissipating cover and a re-distribution layer. The insulating layer has an accommodating opening. The chip is disposed in the accommodating opening. The chip has an active surface, a back surface opposite to the active surface and a side surface connected to the active surface and the back surface. The thermal interface material is filled in the accommodating opening for at least encapsulating the side surface of the chip and exposing the active surface. The re-distribution layer and the heat-dissipating cover are disposed on two sides of the insulating layer respectively, and the heat-dissipating cover is thermally coupled to the chip via the thermal interface material. The re-distribution layer covers the active surface of the chip and the thermal interface material, and the re-distribution layer is electrically connected to the chip.

In an embodiment of the invention, the thermal interface material covers the back surface and the side surface of the chip.

In an embodiment of the invention, the heat-dissipating cover contacts the insulating layer and the thermal interface material.

In an embodiment of the invention, the thermal interface material exposes the back surface of the chip, and the heat-dissipating cover contacts the insulating layer, the thermal interface material and the back surface of the chip.

In an embodiment of the invention, the insulating layer has a first surface and a second surface opposite to the first surface. The heat-dissipating cover is disposed on the first surface while the re-distribution layer is disposed on the second surface, and the back surface of the chip cuts with the first surface of the insulating layer.

In an embodiment of the invention, the re-distribution layer includes at least one patterned conductive layer and at least one patterned dielectric layer that are stacked alternately.

In an embodiment of the invention, the semiconductor package further includes a plurality of solder balls. The plurality of solder balls are electrically connected to the chip via the re-distribution layer.

In an embodiment of the invention, the solder balls and the chips are located on two sides of the re-distribution layer respectively.

A method for manufacturing a semiconductor package is provided, which includes the following steps. A heat-dissipating cover is formed on a carrier. An insulating layer is formed on the heat-dissipating cover, and the insulating layer has at least one accommodating opening to expose a portion of the heat-dissipating cover. A chip is disposed in the accommodating opening, and a thermal interface material is filled in the accommodating opening, so that the thermal interface material covers the chip and exposes an active surface of the chip. A re-distribution layer is formed on the insulating layer, the thermal interface material and the active surface of the chip, wherein the re-distribution layer is electrically connected to the chip.

In an embodiment of the invention, the method for manufacturing the semiconductor package further includes forming a plurality of solder balls on the re-distribution layer, wherein the solder balls are electrically connected to the chip via the re-distribution layer.

In an embodiment of the invention, the method for manufacturing the semiconductor package further includes separating the heat-dissipating cover from the carrier.

A method for manufacturing a semiconductor package is provided, which includes the following steps. A heat-dissipating material layer is formed on a carrier. An insulating material layer is formed on the heat-dissipating material layer. The insulating material layer has a plurality of accommodating openings to expose a portion of the heat-dissipating material layer. A plurality of chips are disposed in the accommodating openings respectively, and a thermal interface material is filled in the accommodating openings, so that the thermal interface material covers the chips and exposes active surfaces of the chips. A re-distribution circuit structure is formed on the insulating material layer, the thermal interface material and the active surfaces of the chips, wherein the re-distribution circuit structure includes a plurality of re-distribution layers, and each of the re-distribution layers is electrically connected to a corresponding chip respectively.

In an embodiment of the invention, the method for manufacturing the semiconductor package further includes forming a plurality of groups of solder balls on the re-distribution layer, wherein each group of solder balls are electrically connected to the corresponding chip via one of the re-distribution layers.

In an embodiment of the invention, the method for manufacturing the semiconductor package further includes separating the heat-dissipating material layer from the carrier.

In an embodiment of the invention, the method for manufacturing the semiconductor package further includes cutting the heat-dissipating material layer, the insulating material layer and the re-distribution circuit structure along a pre-determined cutting line to form a plurality of semiconductor packages.

Based on the above, the semiconductor package of the invention at least covers the side surface of the chip located within the accommodating opening of the insulating layer via the thermal interface material and contacts the thermal interface material via the heat-dissipating cover, so as to have preferable heat-dissipating efficiency. On the other hand, the method for manufacturing the semiconductor package is provided, capable of manufacturing the semiconductor package having preferable heat-dissipating efficiency.

To make the above features and advantages of the present invention more comprehensible, several embodiments accompanied with drawings are described in detail as follows.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1A:
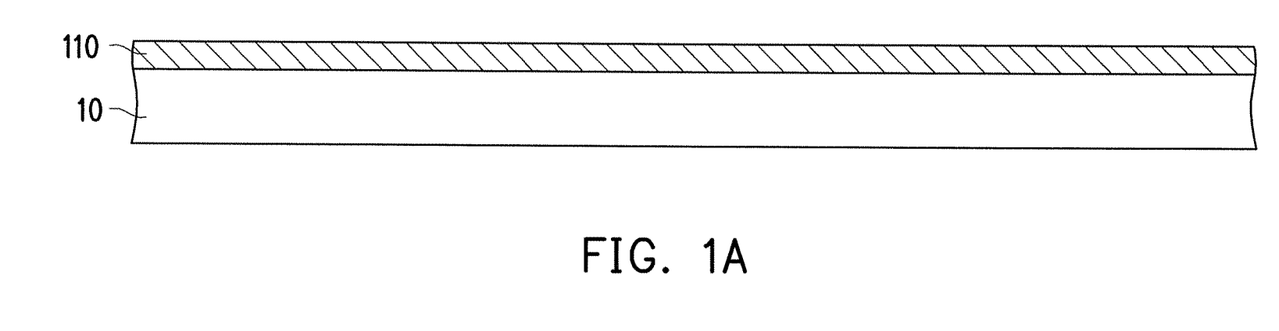
FIGS. 1A to 1G illustrate a manufacturing process of a semiconductor package according to an embodiment of the invention.

FIGS. 1A to 1G illustrate a manufacturing process of a semiconductor package according to an embodiment of the invention. Referring to FIG. 1A, a carrier 10 is provided first, and a heat-dissipating material layer 110 is formed on the carrier 10. For instance, the carrier 10 may be a sheet formed by a rigid material or a flexible material, or a release film such as a thermal release film, a UV release film or other adequate films), but the invention does not limit on the material of the carrier 10. Herein, the heat-dissipating material layer 110 is, for example, temporarily secured on the carrier 10 by means of adhesion, so as to facilitate subsequent processes. In this embodiment, the heat-dissipating material layer 110 may be formed by aluminum, magnesium, copper, silver, gold or other metal or metal alloys having good thermal conductivity, or formed by graphite or other non-metal materials having good thermal conductivity.

Figure 1B:
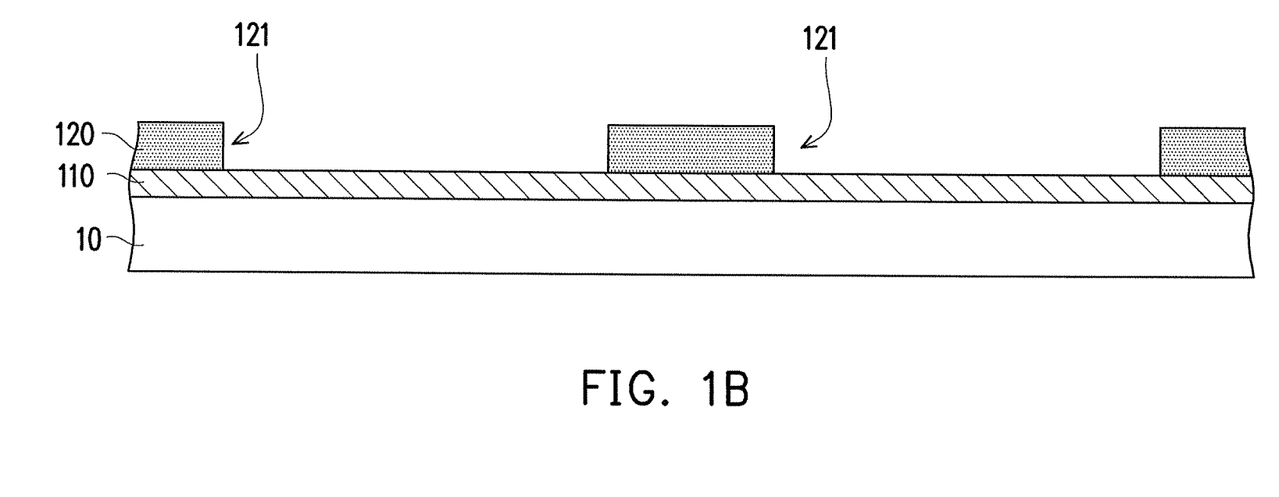

Then, referring to FIG. 1B, an insulating material layer 120 is formed on the heat-dissipating material layer 110, wherein a material of the insulating material layer 120 may be polyimide, epoxy, Si, $SiO_x$ or other adequate insulating materials. Herein, the insulating material layer 120 may have a plurality of accommodating openings 121 to expose a portion of the heat-dissipating material layer 110. For instance, the manufacturing of the insulating material layer 120 may be performed by first forming a layer of the insulating material all over the heat-dissipating material layer 110, and then forming the accommodating openings 121 on a specific area of the insulating material via processes such as exposure and development or laser opening, so as to obtain an patterned insulating material layer 120. Alternatively, the insulating material layer 120 having accommodating openings 121 may be formed directly on the heat-dissipating material layer 110 by means of ink-jet printing, screen printing, curtain printing, spray coating printing or dry film adhesion, etc. However, the invention does not pose any limit on the manufacturing method for forming the insulating material layer 120.

Figure 1C:
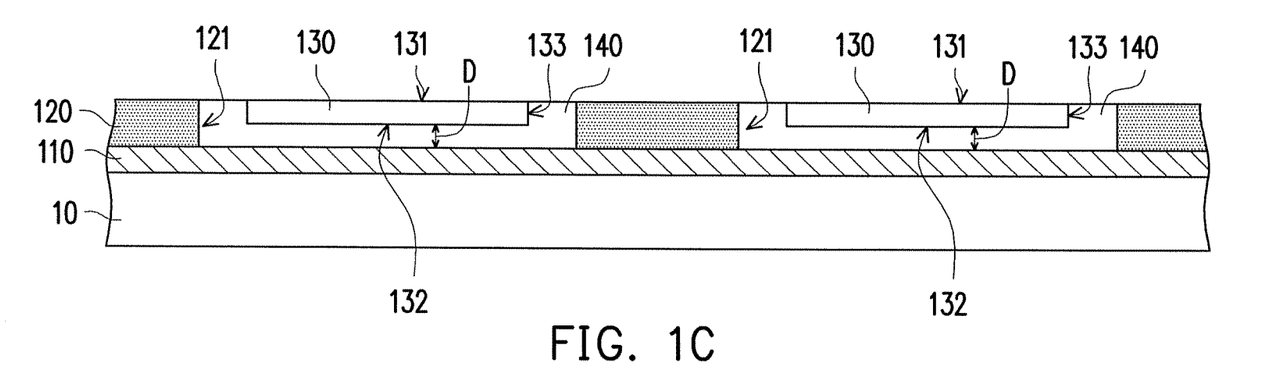

Next, referring to FIG. 1C, a plurality of chips 130 are disposed in the accommodating openings 121 respectively, and a thermal interface material 140 is filled in the accommodating openings 121, wherein the thermal interface material 140 may be a thermal glue, a thermal grease, a thermal film or a thermal tape. It should be noted that the invention does not limit on the order of placing the chips 130 in the accommodating openings 121 and filling the thermal interface material 140 in the accommodating openings 121, so as to be applicable to manufacturing processes for the thermal interface material 140 to cover at least a side surface 133 of the chips 130 and expose active surfaces 131 of the chips 130.

In this embodiment, for example, the thermal interface material 140 is filled in the accommodating openings 121 first, and then the chips 130 are placed in the accommodating openings 121 having the thermal interface material 140 while back surfaces 132 opposite to the active surfaces 131 of the chips 130 keep distances D from the heat-dissipating material layer 110 (that is, the back surfaces 132 of the chips 130 do not contact the heat-dissipating material layers 110). In another embodiment, for example, the chips 130 are placed in the accommodating openings 121 first, so that the back surfaces 132 of the chips 130 contact the heat-dissipating material layer 110. Then, the thermal interface material 140 is filled in the accommodating openings 121 along a gap between the side surfaces 133 of the chips 130 and inner walls of the accommodating openings 121. In yet another embodiment, for example, the chips 130 are placed in the accommodating openings 121 first, so that the back surfaces 132 of the chips 130 contact the heat-dissipating material layer 110. Then, a thermal tape or a thermal film is pressed into the accommodating openings 121 by means of vacuum lamination. When needed, a portion of the thermal tape or the thermal film covering the active surfaces 131 of the chips 130 may be removed to expose the active surface 131.

Figure 1D:
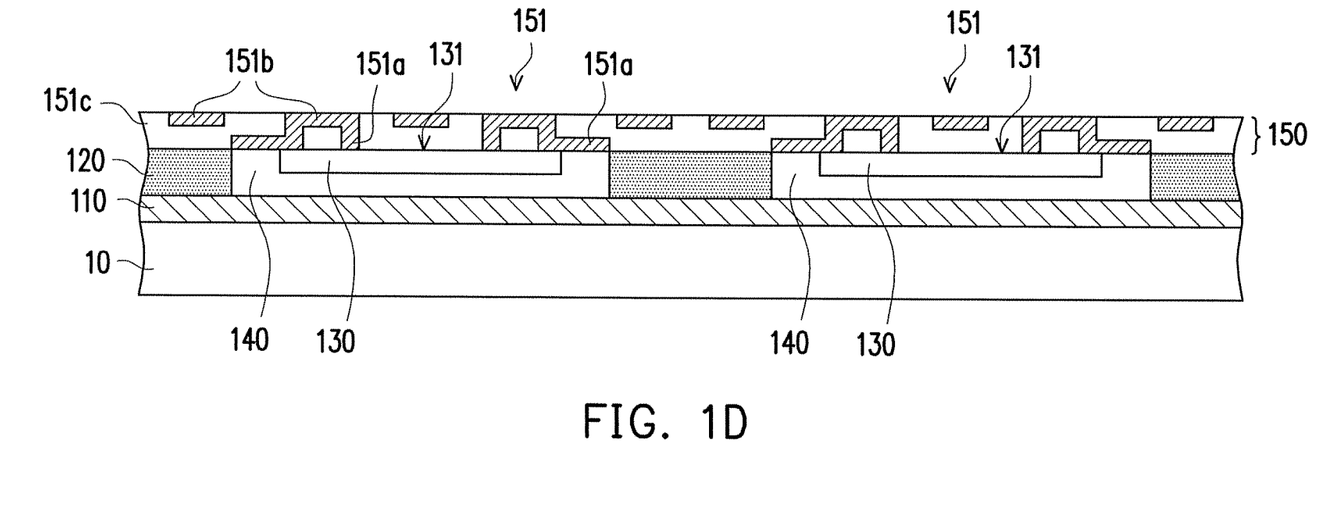

Next, referring to FIG. 1D, a re-distribution circuit structure 150 is formed on the insulating material layer 120, the thermal interface material 140 and the active surface 131 of each chip 130 via re-distribution process, wherein the re-distribution circuit structure 150 includes a plurality of re-distribution layers 151, and each of the re-distribution layers 151 is electrically connected to the corresponding chip 130 respectively. More specifically, each of the re-distribution layers 151 includes patterned conductive layers 151a and 151b and an patterned dielectric layer 151c that are stacked alternately, wherein each of the re-distribution layers 151 connects to the active surface 131 of the corresponding chip 130 via the patterned conductive layer 151a, and a portion of the patterned conductive pattern 151a contacts the thermal interface material 140. On the other hand, the patterned dielectric layer 151c exposes the patterned dielectric conductive layer 151b. It should be noted that the re-distribution layers are, for example, multi-layer circuit structures, and the number of circuit layers may vary according to actual needs.

Figure 1E:
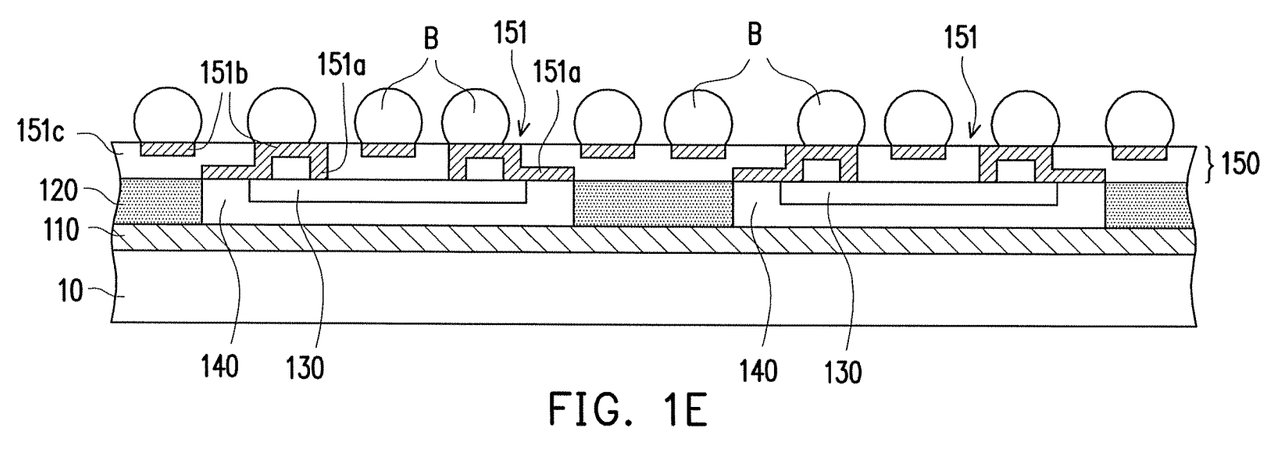

Then, referring to FIG. 1E, balling and reflowing processes are performed to form a plurality of groups of solder balls B on the re-distribution layers 151, wherein each of the groups of solder balls B is connected to the corresponding patterned conductive layer 151b in the re-distribution layers 151 respectively, so as to be electrically connected to the corresponding chip 130. In general, a material of the solder balls B may include Tin, a Tin-Lead alloy or a Lead-free solder. Next, referring to FIG. 1F, the carrier 10 is removed from the heat-dissipating material layer 110, that is, the heat-dissipating material layer 110 and the carrier 10 are separated.

Figure 1F:
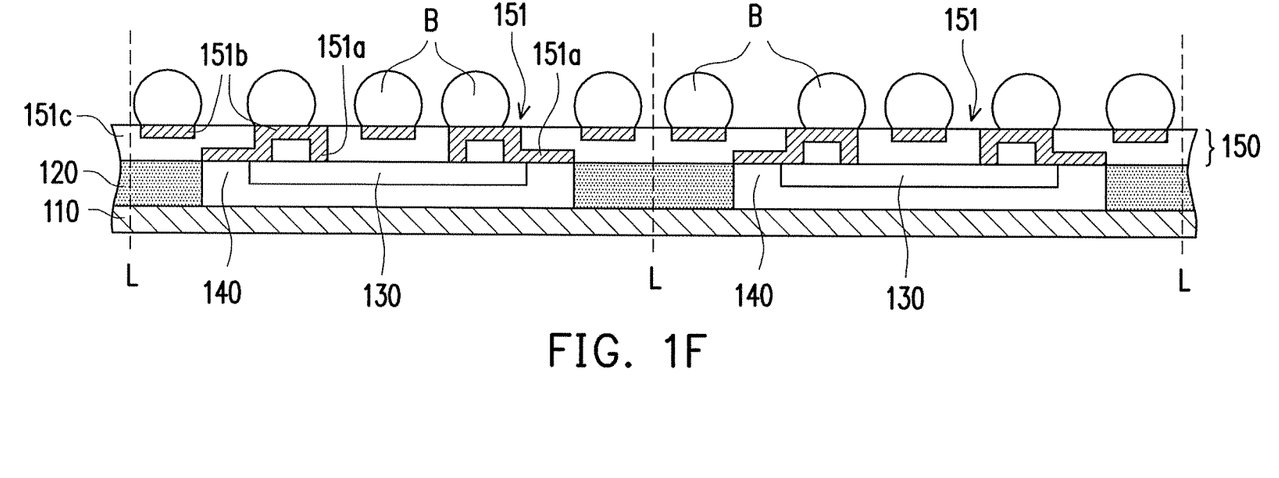
Figure 1G:
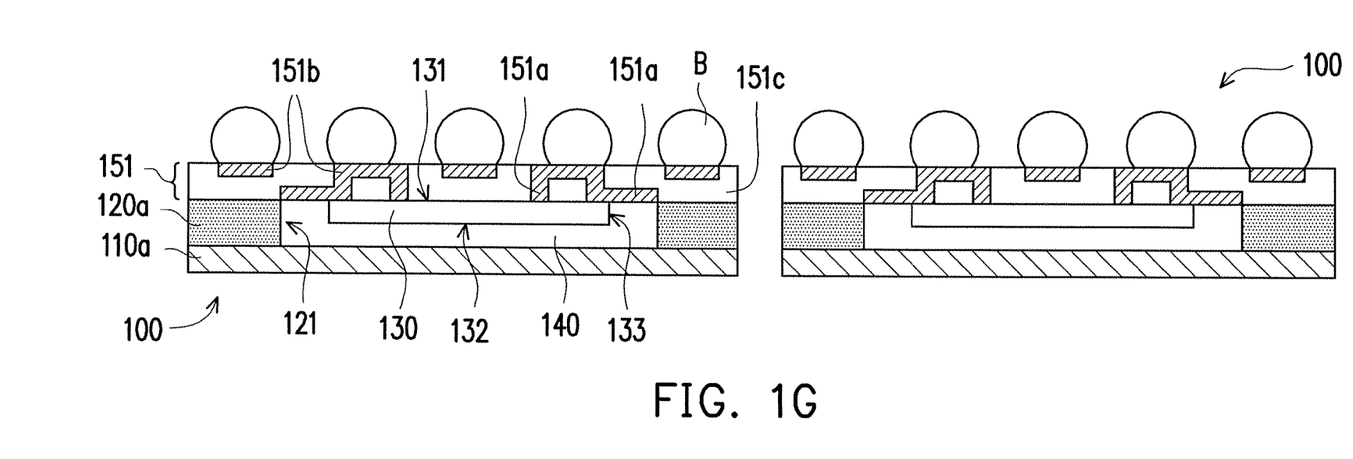

Finally, referring to both FIGS. 1F and 1G, a singulation process is performed along a pre-determined cutting line L between any two adjacent chips 130, so as to form a plurality of semiconductor packages 100. For instance, a cutting tool or a laser cuts along the pre-determined cutting line L that passes through the heat-dissipating material layer 110, the insulating material layer 120 and the patterned dielectric layer 151c of the re-distribution circuit structure 150, and the primary principle is to avoid harming the solder balls B. Now, the manufacturing of the semiconductor package 100 has been substantially completed, wherein the cut heat-dissipating material layer 110 forms a heat-dissipating cover 110a of the semiconductor package 100, and the cut insulating material layer 120 forms an insulating layer 120a of the semiconductor package 100.

During the manufacturing process of the semiconductor package 100, the patterned insulating material layer 120 (i.e. the insulating material layer 120 having the plurality of accommodating openings 121) is used to substitute for a frame used in conventional press molding processes. Therefore, part of the manufacturing processes and required assistive device in conventional semiconductor packaging are dispensed, which thereby helps reduce a package thickness of the semiconductor package 100 and a cost for manufacturing the same.

Referring to FIG. 1G, in this embodiment, the semiconductor package 100 includes the heat-dissipating cover 110a, the insulating layer 120a, the chip 130, the thermal interface material 140 and the re-distribution layer 151. The chip 130 is disposed within the accommodating opening 121 of the insulating layer 120a. The thermal interface material 140 is filled in the accommodating opening 121 for encapsulating the side surface 133 and the back surface 132 of the chip 130 and exposing the active surface 131. The re-distribution layer 151 and the heat-dissipating cover 110a are disposed on two opposite sides of the insulating layer 120a respectively. Since the heat-dissipating cover 110a contacts the insulating layer 120a and the thermal interface material 140 without directly contacting the back surface 132 of the chip 130, the heat-dissipating cover 110a in this embodiment is, for example, thermally coupled to the chip 130 via the thermal interface material 140.

On the other hand, the re-distribution layer 151 covers the active surface 131 and the thermal interface material 140 of the chip 130, wherein the re-distribution layer 151 is, for example, connected to the active surface 131 of the chip 130 via the patterned conductive layer 151a to be electrically connected to the chip 130, and a portion of the patterned conductive layer 151a contacts the thermal interface material 140. The solder balls B are respectively connected to the patterned conductive layers 151b of the re-distribution layer 151, so as to be electrically connected to the chip 130. Herein, the solder balls B and the chip 130 are disposed respectively on two opposite sides of the re-distribution layer 151.

In this embodiment, the back surface 132 and the side surface 133 of the chip 130 are covered by the thermal interface material 140, and therefore the heat-dissipating area of the chip 130 is enhanced. Furthermore, the heat-dissipating cover 110a is thermally coupled to the chip 130 via the thermal interface material 140, and therefore heat generated during operation of the chip 130 is transmitted to the outside rapidly via the thermal interface material 150 and the heat-dissipating cover 110a. In addition, since the portion of the patterned conductive layer 151a contacts the thermal interface material 140, heat generated in the re-distribution layer 151 is also transmitted to the outside rapidly via the thermal interface material 140 and the heat-dissipating cover 110a or be transmitted to the outside via the solder balls B. Accordingly, a warpage does not easily occur in the semiconductor package 100 due to the heat accumulated therein.

Other embodiments are provided below for further illustration. It should be noted herein that the reference numerals and part of the contents in the previous embodiment are used in the following embodiments, in which identical reference numerals indicate identical or similar components, and repeated description of the same technical contents is omitted. For detailed description of the omitted parts, reference can be found in the previous embodiment, and no description will be repeated in the following embodiments.

Figure 2:
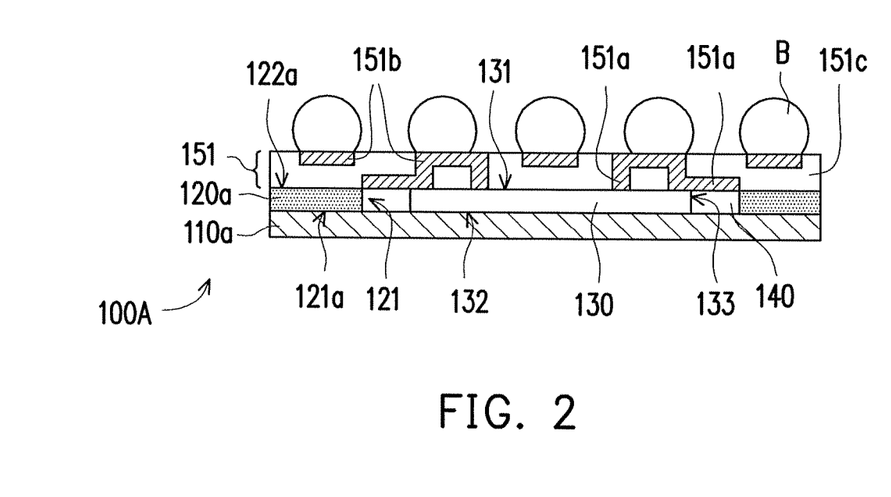
FIG. 2 is a schematic view of a semiconductor package according to another embodiment of the invention.

FIG. 2 is a schematic view of a semiconductor package according to another embodiment of the invention. Referring to FIG. 2, the semiconductor package 100A in this embodiment is substantially similar to the semiconductor package 100 in the previous embodiment, and the primary difference therebetween lies in: the thermal interface material 140 in this embodiment exposes the back surface 132 of the chip 130, and the heat-dissipating cover 110a contacts the insulating layer 120a, the thermal interface material 140 and the back surface 132 of the chip 130. More particularly, the insulating layer 120a has a first surface 121a and a second surface 122a opposite to the first surface 121a, and the heat-dissipating cover 110a is disposed on the first surface 121a while the re-distribution layer 151 is disposed on the second surface 122a. In addition, the back surface 132 of the chip 130, for example, cuts with the first surface 121a of the insulating layer 120a.

Based on the above, the semiconductor package of the invention at least covers the side surface of the chip within the accommodating opening of the insulating layer via the thermal interface material and contacts the thermal interface material via the heat-dissipating cover, so that the heat-dissipating cover is thermally coupled to the chip via the thermal interface material. Thereby, the heat generated during operation of the chip is transmitted to the outside rapidly via the thermal interface material and the heat-dissipating cover. In addition, since a portion of the patterned conductive layer contacts the thermal interface material, heat generated in the re-distribution layer is also transmitted to the outside rapidly via the thermal interface material and the heat-dissipating cover or be transmitted to the outside via the solder balls. Accordingly, the semiconductor package of the invention has preferable heat-dissipating efficiency, and the warpage does not easily occur due to the heat.

On the other hand, the method for manufacturing the semiconductor package introduced herein not only manufactures the semiconductor package having preferable heat-dissipating efficiency but is also able to use the patterned insulating material layer (i.e. the insulating material layer having the plurality of accommodating openings) to substitute for the frame used in conventional press molding processes. Therefore, part of the manufacturing processes and the required aids in conventional semiconductor packaging are dispensed, which thereby helps reduce the package thickness of the semiconductor package and the cost for manufacturing the same.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A method for manufacturing a semiconductor package, comprising:
    forming a heat-dissipating material layer on a carrier;
    forming an insulating material layer on the heat-dissipating material layer, the insulating material layer having a plurality of accommodating openings to expose a portion of the heat-dissipating material layer;
    disposing a plurality of chips in the accommodating openings respectively and filling a thermal interface material in the accommodating openings, so that the thermal interface material covers the chips and exposes active surfaces of the chips, wherein the insulating material layer, the thermal interface material, and the active surfaces of the chips are coplanar to each other; and
    forming a re-distribution circuit structure directly on the insulating material layer, the thermal interface material and the active surfaces of the chips, wherein the re-distribution circuit structure comprises a plurality of re-distribution layers, and each of the re-distribution layers is electrically connected to a corresponding chip respectively.

2. The method for manufacturing the semiconductor package according to claim 1, further comprising:
    forming a plurality of groups of solder balls on the re-distribution layers, wherein each group of solder balls is electrically connected to a corresponding chip respectively via one of the re-distribution layers.

3. The method for manufacturing the semiconductor package according to claim 2, further comprising:
    separating the heat-dissipating material layer from the carrier.

4. The method for manufacturing the semiconductor package according to claim 1, further comprising:
    cutting the heat-dissipating material layer, the insulating material layer and the re-distribution circuit structure along a per-determined cutting line to form a plurality of semiconductor packages.

5. A method for manufacturing a semiconductor package, the semiconductor packaging comprising a heat dissipating cover, an insulating layer disposed on the heat dissipating cover, a chip disposed on an accommodating opening of the insulating layer, a thermal interface material disposed on the accommodating opening of the insulating layer and a re-distribution layer disposed on the chip, the insulating layer, and the thermal interface material, the method comprising:
    forming the heat-dissipating cover on a carrier;
    forming the insulating layer having the accommodating opening on the heat-dissipating cover, the accommodating opening exposing a portion of the heat-dissipating cover;
    filling the accommodating opening with the thermal interface material;
    disposing the chip in the accommodating opening, wherein at least one side surface of the chip is covered by the thermal interface material, wherein the insulating layer, the thermal interface material, and an active surface of the chip are coplanar to each other;
    forming the re-distribution layer directly on the insulating layer, the thermal interface material and the active surface of the chip; and
    separating the heat-dissipating cover and the carrier.

6. The method for manufacturing the semiconductor package according to claim 5, further comprising:
    forming a plurality of solder balls on the re-distribution layer.

7. The method for manufacturing the semiconductor package according to claim 6, wherein the plurality of solder balls is electrically connected to the chip through the re-distribution layer.

8. The method for manufacturing the semiconductor package according to claim 5, wherein disposing the chip in the accommodating opening is disposing the chip in the accommodating opening to have a back surface of the chip covered by the thermal interface material.

9. The method for manufacturing the semiconductor package according to claim 5, wherein disposing the chip in the accommodating opening is disposing the chip in the accommodating opening to have a back surface of the chip covered by at least one part of the heat-dissipating cover.

10. The method for manufacturing the semiconductor package according to claim 5, wherein forming the insulating layer having the accommodating opening on the heat-dissipating cover is forming the insulating layer having the accommodating opening on the heat-dissipating cover using ink-jet printing, screen printing, curtain printing, spray coating printing or dry film adhesion.

11. The method for manufacturing the semiconductor package according to claim 5, wherein directly forming the re-distribution layer on the insulating layer, the thermal interface material and the active surface of the chip is forming a patterned dielectric layer and a patterned conductive layer on the insulating layer, wherein the patterned conductive layer is electrically connected to the chip.

12. The method for manufacturing the semiconductor package according to claim 5, wherein the insulating layer is formed to have a first surface and a second surface opposite to the first surface, the first surface adhering to the heat-dissipating cover, the second surface of the insulating layer and the active surface of the chip are formed to be coplanar and adhering to the re-distribution layer.

13. The method for manufacturing the semiconductor package according to claim 5, wherein a plurality of semiconductor packages are formed simultaneously to each other and separated by cutting the heat-dissipating material layer formed by a plurality of heat dissipating covers, the insulating material layer formed by a plurality of insulating layers, and the re-distribution circuit structure formed by a plurality of re-distribution layers along a per-determined cutting line.

14. The method for manufacturing the semiconductor package according to claim 5, wherein the thermal interface material is filled into the accommodating opening along an inner wall of the accommodating opening, and the at least one side surface of the chip is perpendicular to an interface between the heat-dissipating cover and the thermal interface material.

15. The method for manufacturing the semiconductor package according to claim 14, wherein the step of filling the accommodating opening is performed after the step of forming the insulating layer.

* * * * *